(12) United States Patent
Tzeng et al.

(10) Patent No.: US 6,726,774 B2
(45) Date of Patent: Apr. 27, 2004

(54) BUBBLE DETECTION SYSTEM FOR DETECTING BUBBLES IN PHOTORESIST TUBE

(75) Inventors: Jia-Hau Tzeng, Hsinchu (TW); Yuh-Tong Tsay, Hsinchu (TW); Chung-Te Tsai, Hsinchu (TW); Cheng-Yi Lin, Hsinchu (TW); Mao-I Ting, Hsinchu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 14 days.

(21) Appl. No.: 10/196,290

(22) Filed: Jul. 17, 2002

(65) Prior Publication Data

US 2004/0011285 A1 Jan. 22, 2004

(51) Int. Cl.⁷ .................................. B05C 11/00
(52) U.S. Cl. .................. 118/688; 118/713; 702/100; 222/52; 73/861.41
(58) Field of Search .................. 118/713, 688, 118/655, 689, 690, 691; 73/60.11, 841.41, 439; 222/52; 702/100

(56) References Cited

U.S. PATENT DOCUMENTS 6,024,249 A * 2/2000 On .............................. 222/52
6,355,105 B1 * 3/2002 Tuan .......................... 118/688

* cited by examiner

Primary Examiner—J. A. Lorengo
Assistant Examiner—George R. Koch, III
(74) Attorney, Agent, or Firm—Birch, Stewart Kolasch & Birch, LLP

(57) ABSTRACT

A bubble detection system to detect bubbles in photoresist. The system includes photoresist at least one tank, a buffer tank, a pump, and a bubble sensor. The photoresist tank provides the photoresist. The buffer tank stores the photoresist from the photoresist tank. The pump pumps the photoresist from the buffer tank to an end terminal. The bubble sensor is set between the buffer tank and the pump to detect bubbles in the photoresist, and outputs an alarm signal when bubbles are detected. The nozzle is set at the end terminal to output the photoresist.

8 Claims, 3 Drawing Sheets

BUBBLE DETECTION SYSTEM FOR DETECTING BUBBLES IN PHOTORESIST TUBE

BACKGROUND OF THE INVENTION

1. Field of the Invention

The present invention relates in general to a photoresist coating system. In particular, the present invention relates to a bubble detection system to detect photoresist bubbles in the pipes of the photoresist coating system.

2. Description of the Related Art

Because most available photoresists are liquid, it is necessary to pump photoresist from a reservoir to a reactor where photoresist is dispensed and coated on a wafer. Moreover, in most present photoresist coating systems, not only are both pump and pipeline used, but also a tank is situated along the pipeline to adjust flow rate of the photoresist before it enters the pump and is sent to the reactor. In other words, the photoresist coating system is designed to allow continual and uniform application to the wafer.

Of course, owing to the fact that in many contemporary semiconductor processes several kinds of photoresists are required, most available photoresist coating systems comprise several pumps, several reservoirs and several tanks, and only one reactor. However, only one reservoir, one pump, one tank and one pipeline are required for each type of photoresist.

It is well known that formation of the photoresist layer is affected by bubbles in the photoresist. When bubbles enter the pump, they are also sent into the reactor. Thus, the quantity of photoresist dispensed on the wafer is fluctuant and the distribution of photoresist on the wafer is also inconsistent, such that the quality of the photoresist layer is compromised by the bubbles. In addition, the bubbles are caused by incomplete sealing of photoresist coating system pipelines and improper operation of the system pump.

To avoid these disadvantages, conventional photoresist coating systems normally use a sensor to detect the presence of bubbles.

FIG. 1 shows the structure of the conventional bubble detection system. The devices of the conventional bubble detection system are connected by pipes.

There is photoresist stored in the photoresist tank 10. $N_2$ is injected into the photoresist tank 10 through the $N_2$ connector 10A to force the photoresist to the L/E tank 12. There is another input terminal (drain) 12A to provide photoresist to the L/E tank 12. A L/E sensor 14 is set between the photoresist tank 10 and the L/E tank 12 to detect bubbles in the pipes therein. The buffer tank 16 stores the photoresist from the L/E tank 12, the drain 16A drains the air out from the buffer tank 16. The pump 18 presses the photoresist in the pipe to the nozzle 19 through the filter 17 to perform the semiconductor processes. The bubble sensor 15 is set between the buffer tank 16 and the pump 18 to detect bubbles in the pipes. When the L/E sensor 12 and the bubble sensor 15 detect bubbles, an alarm instructs the operator to stop the process.

However, in the conventional bubble detection system, the L/E sensor is set in the front terminal of the bubbles detecting system. Thus, if there are bubbles in the L/E tank or in the buffer tank, the system still works and causes poor coating. Actually, the source of bubbles comprises the incomplete sealing of pipelines of the photoresist coating system and improper operation of the pump of the photoresist coating system. If the bubbles aren't detected, the coating effect is deteriorated.

SUMMARY OF THE INVENTION

The object of the present invention is to provide a bubbles detection system, which comprises an additional bubble sensor between the buffer tank and the pump to detect bubbles in the end terminal of the pipe.

Another object of the present invention is to provide a bubbles detection system, which continues to generate conspicuous alarm signals to warn the user to clean the bubbles from the system when detecting the bubbles.

To achieve the above-mentioned object, the present invention provides a bubble detection system to detect bubbles in photoresist, comprising photoresist tanks, a buffer tank, a pump, a bubble sensor, and a nozzle. The photoresist tank provides the photoresist. The buffer tank stores the photoresist from the photoresist tank. The pump pumps the photoresist from the buffer tank to an end terminal. The bubble sensor is set between the buffer tank and the pump to detect bubbles in the photoresist, and outputs an alarm signal when bubbles are detected. The nozzle is set at the end terminal to output the photoresist.

Moreover, the present invention provides a bubble detection system for detecting bubbles in a photoresist pipe, comprises a relay, a first indicating device, a sensor a second indicating device, and a third indicating device. The relay comprises a magnetic switch and a magnetic string. The magnetic switch comprises a first terminal coupled to a first power source and a second terminal, and the magnetic string is coupled between the second terminal and ground. The first indicating device is coupled to the second terminal to output a first alarm signal according to a signal. The sensor is coupled between the first terminal and the second terminal to sense the pipe and outputs the sensing signal to the first indicating device and the magnetic string to turn on the magnetic switch when bubbles are detected. The second indicating device outputs a second alarm signal when the magnetic switch is turned on. The third indicating device is coupled to a second power source to output a third alarm signal when the magnetic switch is turned on.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
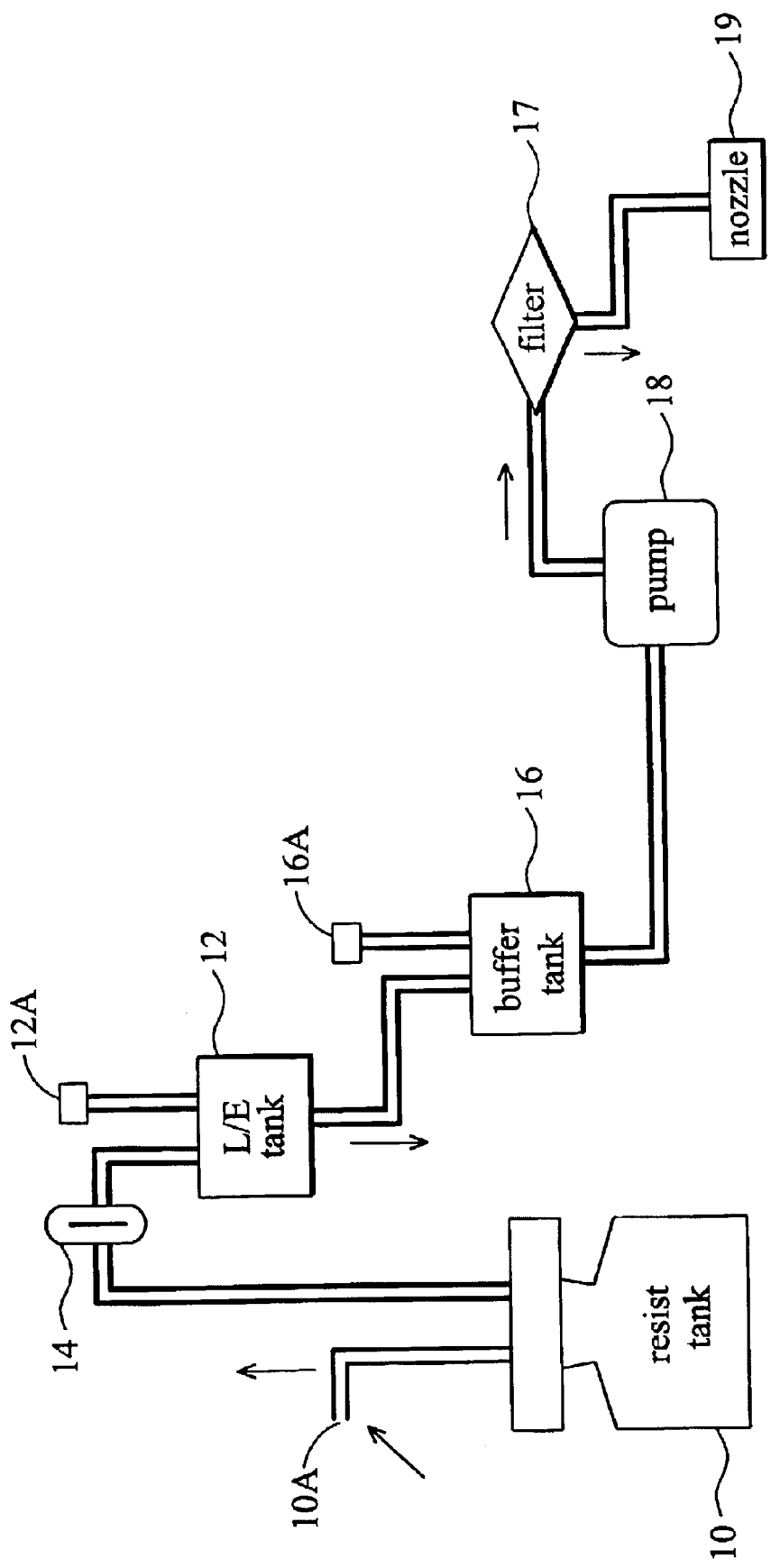
FIG. 1 shows the structure of the conventional bubble detection system.
Figure 2:
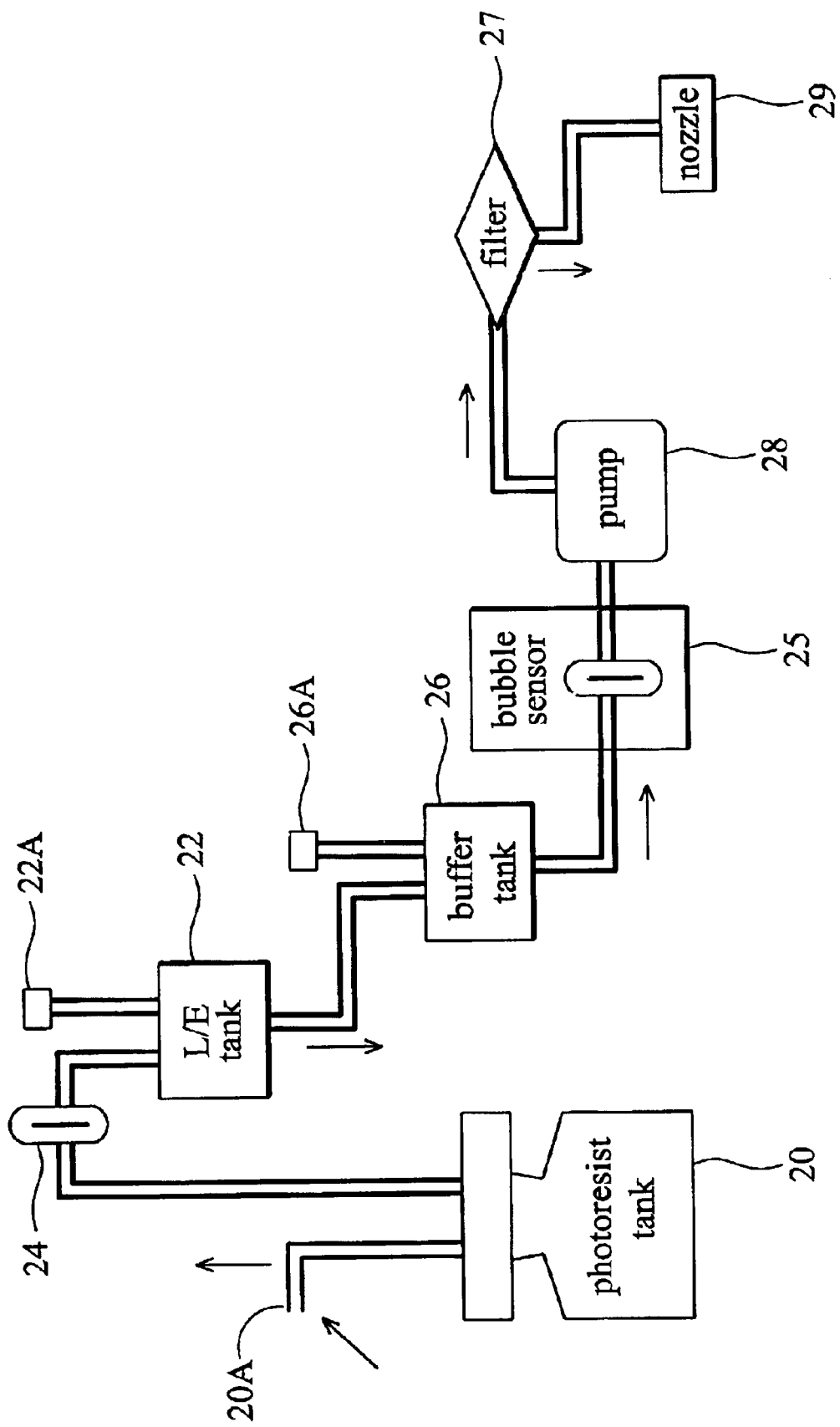
FIG. 2 shows the structure of the bubble detection system of the embodiment according to the present invention.

FIG. 2 shows the structure of the bubble detection system of the present invention. The bubble detection system comprises a series of devices, connected by pipes.

Photoresist is stored in the photoresist tank 20. $N_2$ is injected into the photoresist tank 20 through the $N_2$ connector 20A to force the photoresist to the L/E tank 22. Another input terminal 22A provides the photoresist to the L/E tank 22. A L/E sensor 24 is set between the photoresist tank 20 and the L/E tank 22 to detect bubbles in the pipes therein. The buffer tank 26 stores the photoresist from the L/E tank 22, the drain 26A drains the air from the buffer tank 26. The pump 28 forces the photoresist in the pipe to the nozzle 29 through the filter 27 to perform the semiconductor processes. In addition, the present invention provides a bubble sensor 25 set between the buffer tank 26 and the pump 28 to detect bubbles in the pipes therein. The bubble sensor 25 may detect bubbles using ultrasound, or by light unevenly obstructed by the presence of bubbles in the photoresist.

Thus, the presence of bubbles in the photoresist in front of the bubble sensor 25, located where bubbles are typically generated most frequently, is detected by the bubble sensor 25. Moreover, when the L/E sensor 22 and the bubble sensor 25 detect bubbles, an alarm instructs the operator to stop the process.

Figure 3:
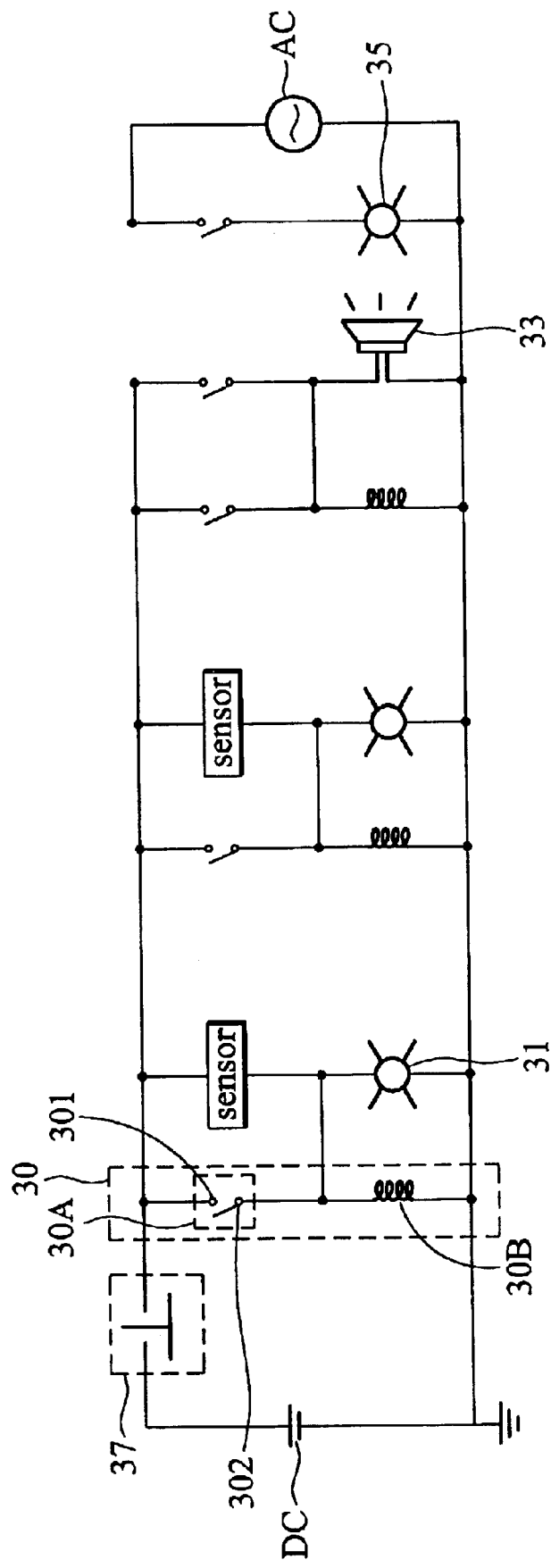
FIG. 3 shows the circuit diagram of the bubble detection system of the present embodiment according to the present invention.

FIG. 3 shows the circuit diagram of the bubble detection system of the present embodiment according to the present invention. The bubble detection system according to the embodiment of the present invention comprises the following devices. The relay 30 comprises a magnetic switch 30A and a magnetic string 30B. The magnetic switch 30A comprises a first terminal 301 coupled to a first power source DC and a second terminal 302, and the magnetic string 30B is coupled between the second terminal 302 and ground. The first indicating device 31 is coupled to the second terminal 302 to outputting a first alarm signal according to a signal. In this embodiment, the first indicating device 31 is a lighting device, and the first alarm signal is the light generated by the lighting device. A sensor is coupled between the first terminal 301 and the second terminal 302 to sense the bubbles in the pipe and to output the sensing signal to the first indicating device 31 and the magnetic string 30B to turn on the magnetic switch 30A when bubbles are detected. The second indicating device 33 is used to output a second alarm signal when the magnetic switch 30A is turned on. In this embodiment, the second indicating device 33 is a buzzer, and the second alarm signal is the noise generated by the buzzer. The third indicating device is coupled to a second power source AC to output a third alarm signal when the magnetic switch is turned on.

In this embodiment, the third indicating device 35 is a lighting device, and the third alarm signal is the light generated by the lighting device. Moreover, the third indicating device 35 can provide the light with more brightness than the first indicating device 31. In addition, a reset switch 37 is set between the first power source DC and the relay 30 to turn off the first power source DC. Thus, when the relay 30 is turned on responding to the sensing signal, it needs to operate the reset switch 37 to turn off the first power source DC to turn off the relay 30.

According to the present invention, the bubble sensor is set near the pump. Thus, the bubbles between the pump and the photoresist tank can be detected by the bubble sensor. In addition, the additional bubble sensor detects bubbles missed by the conventional L/E sensor. Moreover, the bubble sensor of the present invention continues to generate alarm signals to warn the user to clean the bubbles from the system when detecting the bubbles before the reset switch is turned off by the user.

There are three indicating devices for the user, a 12 V DC lighting device, an 110V AC lighting device, and a nozzle. The 110V AC lighting device outputs light with higher brightness than the 12 V DC lighting device, attracting the user's attention more forcefully. The 12 V DC lighting device, the 110V AC lighting device, and the nozzle continuously output signals to remind the user to solve the issues of bubbles in the system until the reset switch turns off.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A bubble detection system for detecting bubbles in a photoresist pipe, comprising:

a relay having a magnetic switch and a magnetic string, wherein the magnetic switch comprises a first terminal coupled to a first power source and a second terminal, and the magnetic string coupled between the second terminal and ground;

a first indicating device coupled to the second terminal for outputting a first alarm signal according to a signal;

a sensor coupled between the first terminal and the second terminal for checking the pipe and outputting a result signal to the first indicating device and the magnetic string to turn on the magnetic switch when bubbles are detected;

a second indicating device for outputting a second alarm signal when the magnetic switch is turned on; and a third indicating device coupled to a second power source for outputting a third alarm signal when the magnetic switch is turned on.

2. The bubble detection system as claimed in claim 1, further comprising a reset switch set between the first power source and the relay to turn off the first power source.

3. The bubble detection system as claimed in claim 1, wherein the first indicating device and the third indicating device are lighting devices.

4. The bubble detection system as claimed in claim 1, wherein the first power source is 12V DC power source, and the second power source is 110V AC power source.

5. An bubble detection system for detecting bubbles in a photoresist pipe, comprising:

a relay having a magnetic switch and a magnetic string, wherein the magnetic switch has a first terminal coupled to a first power source and a second terminal, and the magnetic string is coupled between the second terminal and ground;

a first lighting device coupled to the second terminal for outputting a first alarm signal according to a signal;

a sensor coupled between the first terminal and the second terminal for checking the pipe and outputting a result signal to the first indicating device and the magnetic string to turn on the magnetic switch when bubbles are detected;

a buzzer for outputting a second alarm signal when the magnetic switch is turned on; and a second lighting device coupled to a second power source for outputting a third alarm signal when the magnetic switch is turned on.

6. The bubble detection system as claimed in claim 5, further comprising a reset switch set between the first power source and the relay to turn off the first power source.

7. The bubble detection system as claimed in claim 5, wherein the first power source is 12V DC power source, and the second power source is 110V AC power source.

8. The bubble detection system as claimed in claim 5, wherein the output power of the second lighting device is higher than the first lighting device.

* * * * *